(12) United States Patent
Liu et al.

(10) Patent No.: US 10,121,869 B2
(45) Date of Patent: Nov. 6, 2018

(54) METHOD OF MANUFACTURING SEMICONDUCTOR MEMORY DEVICE

(71) Applicant: UNITED MICROELECTRONICS CORPORATION, Hsinchu (TW)

(72) Inventors: Weichang Liu, Singapore (SG); Zhen Chen, Singapore (SG); Shen-De Wang, Zhudong Township (TW); Wang Xiang, Singapore (SG); Wei Ta, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/832,733

(22) Filed: Dec. 5, 2017

(65) Prior Publication Data

US 2018/0108744 A1   Apr. 19, 2018

Related U.S. Application Data

(62) Division of application No. 15/227,986, filed on Aug. 4, 2016, now Pat. No. 9,865,693.

(51) Int. Cl.

| H01L 27/092 | (2006.01) |
|---|---|
| H01L 29/423 | (2006.01) |
| H01L 29/792 | (2006.01) |
| H01L 29/06 | (2006.01) |
| H01L 27/11568 | (2017.01) |
| H01L 29/66 | (2006.01) |

(52) U.S. Cl.
CPC .. *H01L 29/42344* (2013.01); *H01L 27/11568* (2013.01); *H01L 29/0653* (2013.01); *H01L 29/66833* (2013.01); *H01L 29/792* (2013.01)

(58) Field of Classification Search
CPC .......... H01L 27/11568; H01L 29/0653; H01L 29/42344; H01L 29/792
See application file for complete search history.

(56) References Cited

U.S. PATENT DOCUMENTS

| 5,312,768 | A | * | 5/1994 | Gonzalez | .......... | H01L 21/28525 |
|---|---|---|---|---|---|---|
| | | | | | | 257/E21.166 |
| 2005/0167741 | A1 | * | 8/2005 | Divakaruni | ....... | H01L 21/28114 |
| | | | | | | 257/328 |
| 2006/0068541 | A1 | * | 3/2006 | Chidambaram | ............................ | |
| | | | | | | H01L 21/823807 |
| | | | | | | 438/203 |
| 2006/0148157 | A1 | * | 7/2006 | Tao | .................. | H01L 21/823864 |
| | | | | | | 438/199 |

(Continued)

*Primary Examiner* — Thao P Le
(74) *Attorney, Agent, or Firm* — Ding Yu Tan

(57) ABSTRACT

A method of manufacturing a semiconductor memory device and a semiconductor memory cell thereof are provided. The semiconductor memory device formed from the manufacturing method includes a plurality of semiconductor memory cells and an electric isolating structure. Each semiconductor memory cell includes a substrate, a first gate, a second gate, a first gate dielectric layer, a second gate dielectric layer, and a first spacing film. The first gate and the second gate are formed on the substrate. The first gate dielectric layer is between the first gate and the substrate, whereas the second gate dielectric layer is between the second gate and the substrate. The first spacing film having a side and a top edge is between the first gate and the second gate. The second gate covers the side and the top edge.

6 Claims, 5 Drawing Sheets

(56) References Cited

U.S. PATENT DOCUMENTS

| | | | | |
|---|---|---|---|---|
| 2008/0029831 A1* | 2/2008 | Chen | .................... | H01L 29/665 257/408 |
| 2008/0237743 A1* | 10/2008 | Ramin | .............. | H01L 21/28097 257/407 |
| 2008/0272438 A1* | 11/2008 | Doris | ................ | H01L 21/28176 257/369 |
| 2015/0123175 A1* | 5/2015 | Lin | ...................... | H01L 29/402 257/288 |
| 2015/0364568 A1* | 12/2015 | Wu | .................... | H01L 29/6656 438/197 |

\* cited by examiner

METHOD OF MANUFACTURING SEMICONDUCTOR MEMORY DEVICE

CROSS-REFERENCE TO RELATED PATENT APPLICATIONS

This application is a divisional application of U.S. patent application Ser. No. 15/227,986 filed Aug. 4, 2016, which is incorporated by reference in its entirety.

FIELD OF THE INVENTION

The present invention relates to a method of manufacturing semiconductor device, and more particularly to a method of manufacturing semiconductor memory device comprising a plurality of semiconductor memory cells.

BACKGROUND OF THE INVENTION

Flash memories are popular in modern societies. A conventional flash memory is similar to a CMOS (Complementary Metal-Oxide-Semiconductor) transistor, in which the conventional flash memory includes two gates (also called "gate electrodes") and a spacing film sandwiched between the gates. The spacing film is made of dielectric material and has to electrically isolate both gates from each other to prevent causing a short circuit between the gates, so that the spacing film prefers to have high breakdown voltage. Hence, the spacing film sandwiched between two gates is an important part of the flash memory.

SUMMARY OF THE INVENTION

The present invention provides a method of manufacturing a semiconductor memory device. In the method, a substrate is provided. Then, a plurality of gate structures and a plurality of dielectric caps are formed, wherein the gate structures are formed on the substrate and each comprise a first gate and a first gate dielectric layer between the first gate and the substrate, and the dielectric caps are formed atop the gate structures respectively. Next, a first dielectric layer and a second dielectric layer are formed. The first dielectric layer covers the dielectric caps and a plurality of sidewalls of the gate structures. The second dielectric layer covers the first dielectric layer. Then, partially remove the second dielectric layer to reveal a plurality of top parts of the first dielectric layer and to form a plurality of first spacing films. Then, a plurality of second gates is formed on the substrate. The second gates cover and contact the first dielectric layer and a top edge of the first spacing film. Next, the dielectric caps are removed to reveal the first gates. Then, drains and sources are formed in the substrate.

Based on the above, since the second gates cover the top edges of the first spacing films, the first spacing films can be protected by the second gates. Therefore, the breakdown voltage between the two gates (e.g. first gate and second gate) can be kept or increased

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF EMBODIMENTS

The present invention will now be described more specifically with reference to the following embodiments. It is to be noted that the following descriptions of embodiments of this invention are presented herein for the purpose of illustration and description only. It is not intended to be exhaustive or to be limited to the precise form disclosed.

Figure 1A:
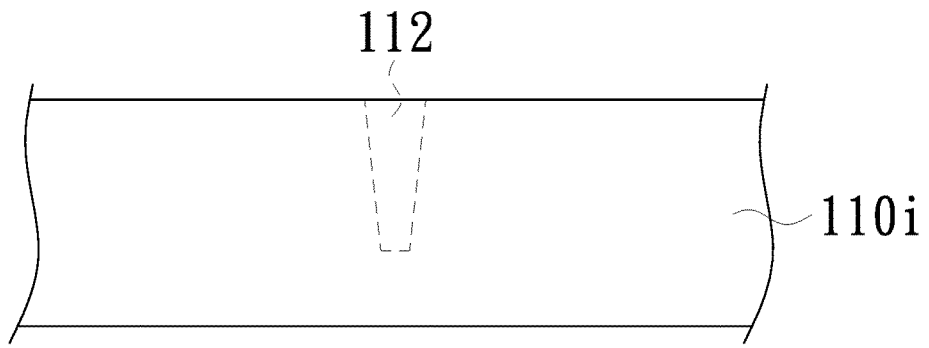
FIG. 1A to FIG. 1I are cross-sectional views of a method of manufacturing a semiconductor memory device in accordance with an embodiment of the present invention.

FIG. 1A to FIG. 1H illustrate a method of manufacturing a semiconductor memory device in accordance with an embodiment of the present invention. Referring to FIG. 1A, in the method, first, provide a substrate 110$i$, which may be a wafer. Then, an electric isolating structure 112 is formed in the substrate 110$i$. The electric isolating structure 112 may be a shallow trench isolation (STI), a field oxide (FOX), or a doping region.

Figure 1B:
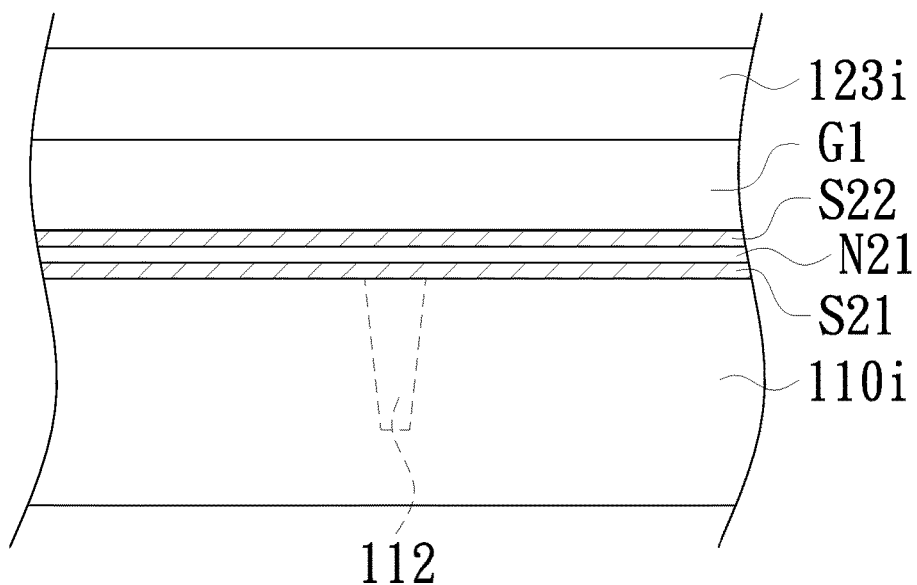
Figure 1C:
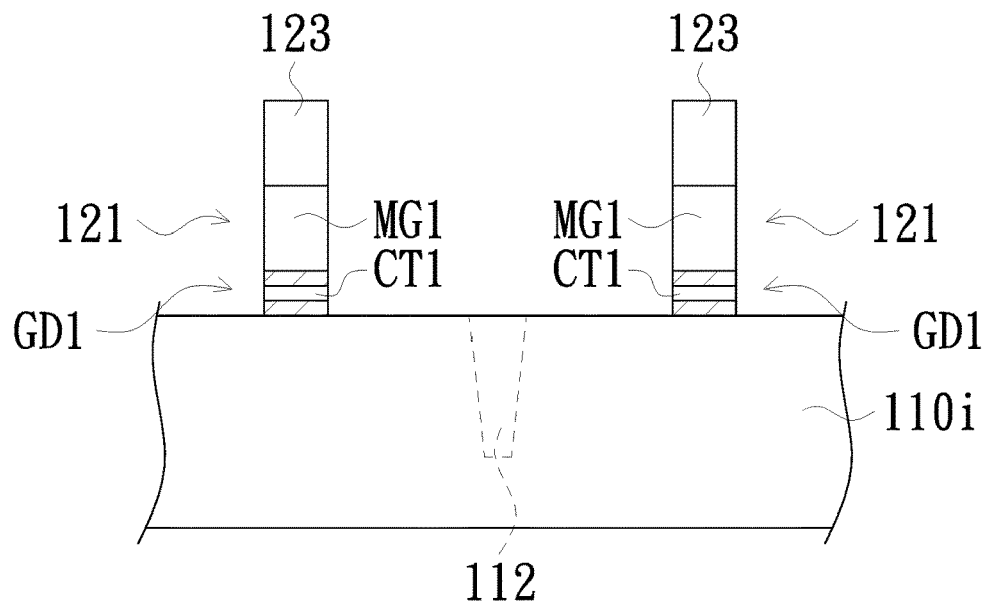

Referring to FIG. 1B and FIG. 1C, after the electric isolating structure 112 is completed, a plurality of gate structures 121 and a plurality of dielectric caps 123 are formed. The gate structures 121 are formed on the substrate 110$i$, and the dielectric caps 123 are formed atop the gate structures 121, respectively. The gate structures 121 and the dielectric caps 123 can be formed by thin-film deposition and photolithography.

In the formation of the gate structures 121 and the dielectric caps 123, multiple films are formed on the substrate 110$i$ first, and the multiple films include a plurality of dielectric films S21, N21, S22, 123$i$, and a semiconductor layer G1. The dielectric films S21, N21, and S22 are formed on the substrate 110$i$ in sequence, where the dielectric film N21 is sandwiched between the dielectric films S21 and S22, and the dielectric film S21 is in contact with the substrate 110$i$. The semiconductor layer G1 is formed between the dielectric films S22 and 123$i$, as shown in FIG. 1B.

The dielectric films S21 and S22 may be silicon oxide films (e.g. $SiO_2$), whereas the dielectric films N21 and 123$i$ may be silicon nitride films (e.g. $Si_3N_4$). The semiconductor layer G1 may be made of poly silicon. The dielectric films S21, N21, S22, 123$i$ and the semiconductor layer G1 can be formed by chemical vapor deposition (CVD). Afterward, photolithography is performed to remove parts of the above-mentioned multiple film and to form the gate structures 121 and the dielectric caps 123.

The rest of the dielectric films S21, N21, S22 and the semiconductor layer G1 become the gate structures 121, and the rest of the dielectric film 123$i$ becomes the dielectric caps 123. The gate structures 121 each include a first gate MG1 and a first gate dielectric layer GD1 between the first gate MG1 and the substrate 110$i$. The first gate MG1 is formed from the semiconductor layer G1, and the first gate dielectric layer GD1 is formed from the dielectric films S21, N21, S22.

In addition, the first gate dielectric layer GD1 includes a charge-trap layer CT1, which is formed from the dielectric film N21. That is, the charge-trap layer CT1 is a silicon nitride film. Moreover, the substrate 110$i$, the first gate dielectric layer GD1, and the first gate MG1 can form a SONOS structure when the charge-trap layer CT1 is silicon nitride film; the dielectric films S21 and S22 are silicon oxide films; and the first gate MG1 is made of poly silicon.

Figure 1D:
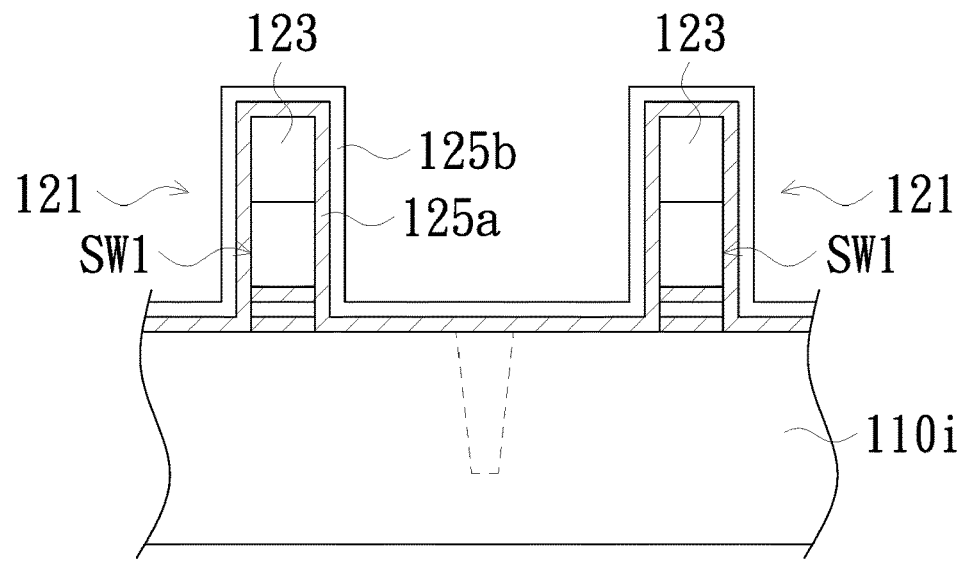

Referring to FIG. 1D, a first dielectric layer 125$a$ and a second dielectric layer 125$b$ are formed. The first dielectric layer 125$a$ covers the dielectric caps 123 and a plurality of sidewalls SW1 of the gate structures 121, whereas the second dielectric layer 125b covers the first dielectric layer 125a. That is, the first dielectric layer 125a is formed between the second dielectric layer 125b and the substrate 110i.

The first dielectric layer 125a and the second dielectric layer 125b also can be formed by thin-film deposition, such as CVD. Both the first dielectric layer 125a and the second dielectric layer 125b which are formed by CVD can conformally cover the gate structures 121 and the dielectric caps 123. Moreover, the first dielectric layer 125a may be a silicon oxide film, and the second dielectric layer 125b may be a silicon nitride film. In other words, the materials (e.g. silicon oxide and silicon nitride) of both the first dielectric layer 125a and the second dielectric layer 125b are different.

Figure 1E:
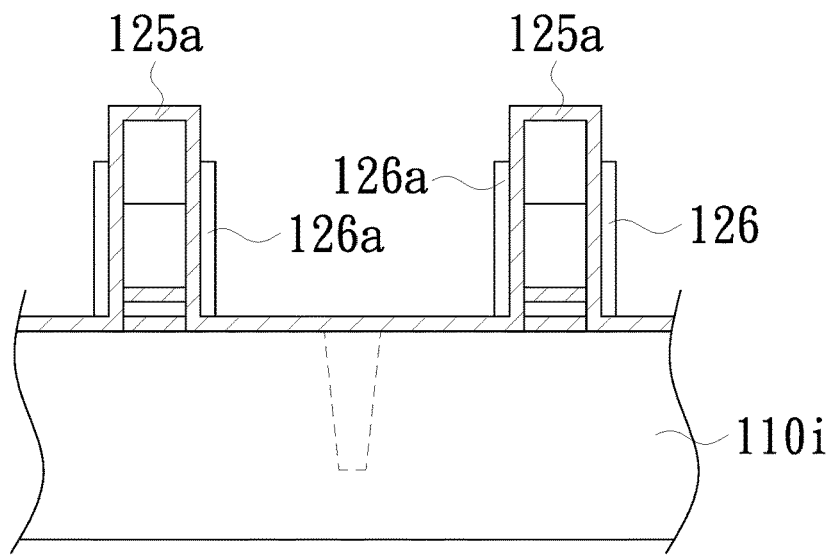

Referring to FIG. 1D and FIG. 1E, then, the second dielectric layer 125b is partially removed to reveal a plurality of top parts of the first dielectric layer 125a and to form a plurality of first spacing films 126a (as shown in FIG. 1E). Partial removal of the second dielectric layer 125b includes performing a plasma etching. That is, the part of the second dielectric layer 125b can be removed by plasma.

The etching rate of the second dielectric layer 125b is different from the etching rate of the first dielectric layer 125a because the materials of both the first dielectric layer 125a and the second dielectric layer 125b are different. During the plasma etching, the etching rate of the second dielectric layer 125b is higher than the etching rate of the first dielectric layer 125a, so that the removed part of the second dielectric layer 125b is more than the removed part of the first dielectric layer 125a. Even, the whole first dielectric layer 125a can be almost remained after the plasma etching according to the embodiment illustrated in FIG. 1E. After the part of the second dielectric layer 125b is removed, the rest of the second dielectric layer 126 forms the first spacing films 126a.

Figure 1F:
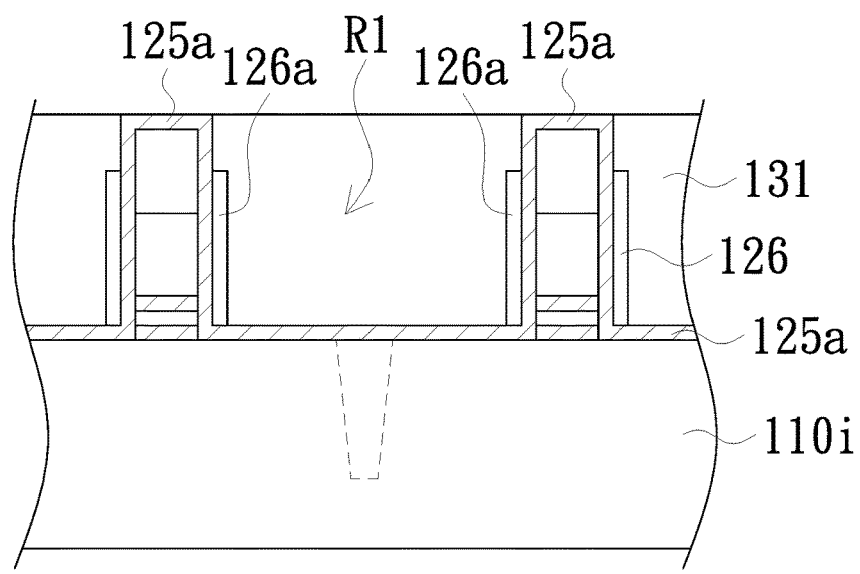
Figure 1G:
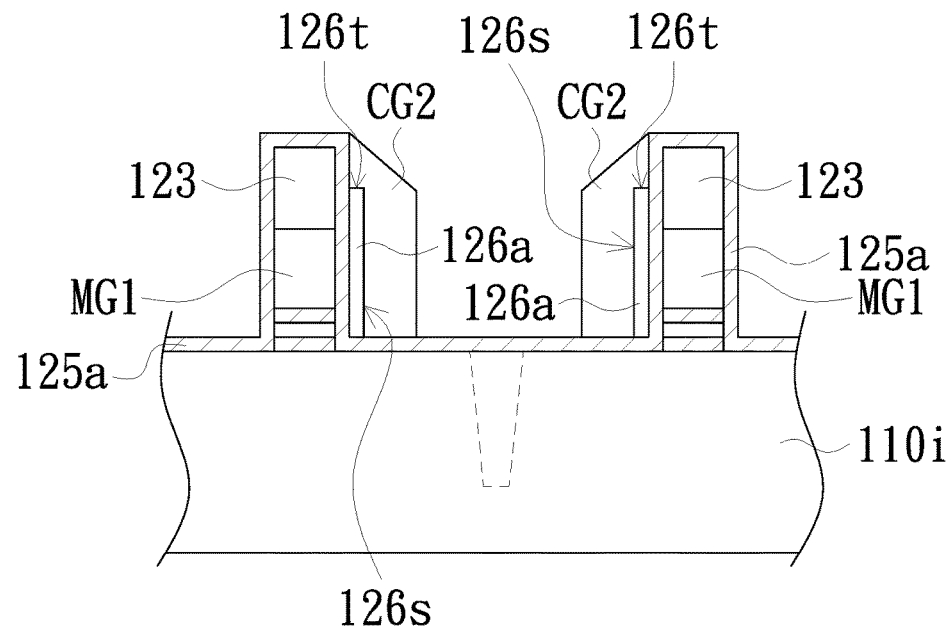

Referring to FIG. 1F and FIG. 1G, subsequently, a plurality of second gates CG2 is formed on the substrate 110i. The second gates CG2 can be formed by thin-film deposition. Specifically, in the formation of the second gates CG2, a semiconductor film 131 is formed on the substrate 110i at first, in which the semiconductor film 131 can be formed by CVD, and the materials of both the semiconductor layer G1 (referring to FIG. 1B) and the semiconductor film 131 may be the same. In addition, the (completed) semiconductor film 131 may fill a depression R1 and cover two adjacent first spacing films 126a, where the depression R1 is defined by the two adjacent first spacing films 126a and the substrate 110i.

After the semiconductor film 131 is completed, the semiconductor film 131 is partially removed to form the second gates CG2. The second gate CG2 covers and contacts the first dielectric layer 125a and a top edge 126t of the first spacing film 126a. Accordingly, each first spacing film 126a is sandwiched between the second gate CG2 and the first dielectric layer 125a, and covered by the second gate CG2 and the first dielectric layer 125a, as shown in FIG. 1G. The removal of the part of the semiconductor film 131 and the formation of the second gates CG2 may be performed by self aligned etching, and the part of the semiconductor film 131 can be removed by dry etching, such as plasma etching.

Since the second gates CG2 can be formed by dry etching (e.g. plasma etching), a top of each second gate CG2 may form an inclined surface, where one inclined surface is opposite to and faces to the other inclined surface, as illustrated in FIG. 1G. In addition, except for the first spacing films 126a, the rest of the second dielectric layer 126 may be removed by etching (e.g. dry etching or wet etching) after the second gates CG2 are completed.

Figure 1H:
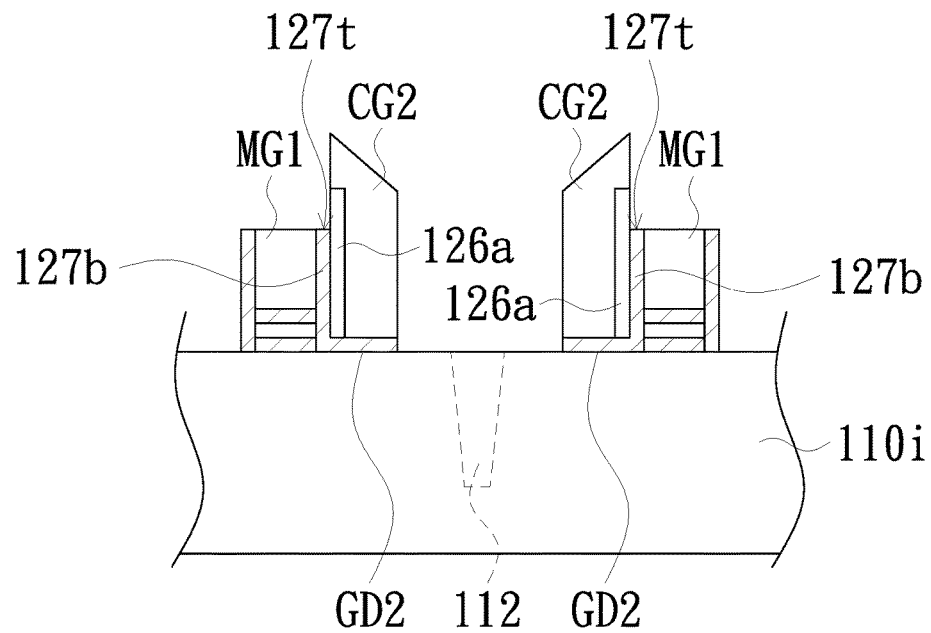

Referring to FIG. 1G and FIG. 1H, afterwards, the dielectric caps 123 are removed to reveal the first gates MG1, in which the removal of the dielectric caps 123 can include performing a wet etching. Because phosphoric acid ($H_3PO_4$) can dissolve silicon nitride, the wet etching can use phosphoric acid as etchant when the material of the dielectric caps 123 is silicon nitride. However, phosphoric acid basically can't dissolve silicon and silicon oxide, so that the first dielectric layer 125a (e.g. silicon oxide) and the first gate MG1 (e.g. poly silicon) can be remained.

The second gates CG2 cover both the top edges 126t and sidewalls 126s of the first spacing films 126a, and each first spacing film 126a is sandwiched between the second gate CG2 and the first dielectric layer 125a and covered by the second gate CG2 and the first dielectric layer 125a, so that the second gates CG2 (e.g. poly silicon) and the second dielectric layer 125b (e.g. silicon oxide) can protect the first spacing films 126a from phosphoric acid, thereby remaining entire first spacing films 126a.

In addition, before the dielectric caps 123 are removed, the first dielectric layer 125a can be partially removed to reveal the dielectric caps 123 and the substrate 110i by etching, such as dry etching (e.g. plasma etching). Therefore, the dielectric caps 123 can be in contact with etchant (e.g. phosphoric acid) and be removed.

Moreover, after the first dielectric layer 125a is partially removed, the rest of the first dielectric layer 125a forms a plurality of second spacing films 127b and a plurality of second gate dielectric layers GD2. Each second spacing film 127b is between the first spacing film 126a and the first gate MG1, whereas each second gate dielectric layer GD2 is between the second gate CG2 and the substrate 110i. Furthermore, the first gate MG1 and the second gate CG2 do not cover a top edge 127t of the second spacing film 127b.

Figure 1I:
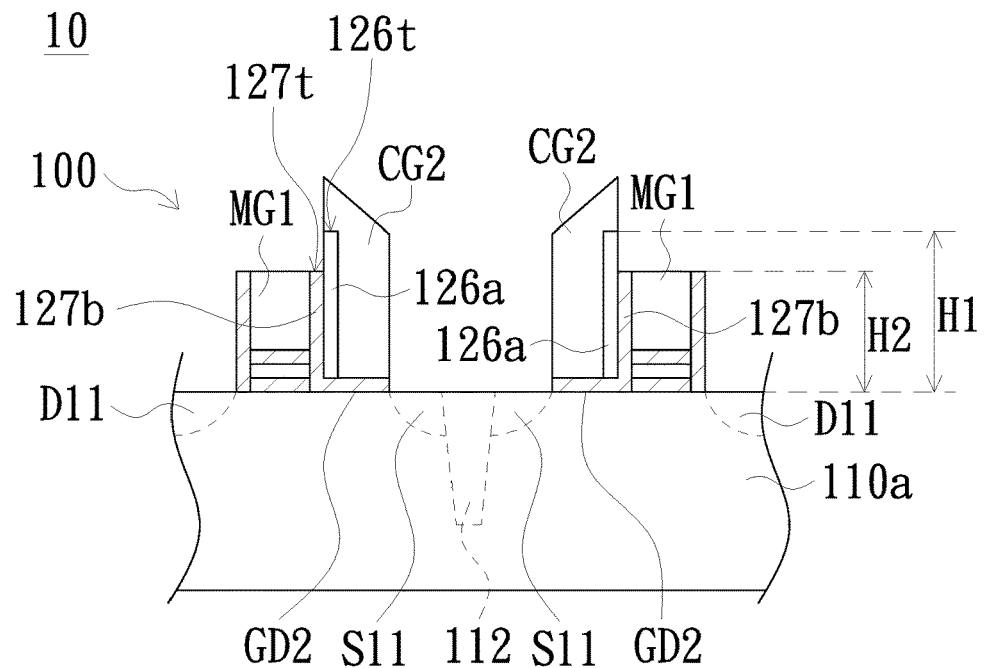
Figure 2:
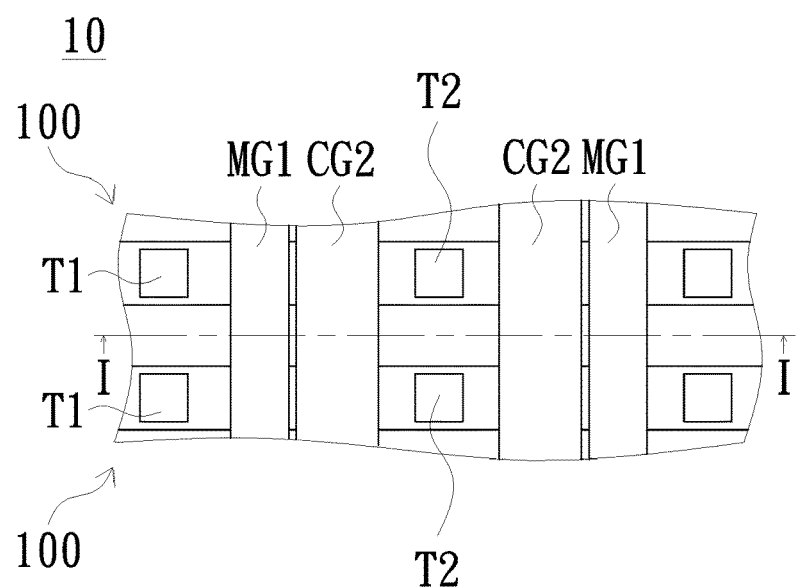
FIG. 2 is a plan view of the semiconductor memory device in FIG. 1I.

Refer to FIG. 1I and FIG. 2, where FIG. 1I. is the cross-sectional view taken along the line I-I in FIG. 2. After the first gates MG1 are revealed by removing the dielectric caps 123, a plurality of drains D11 and a plurality of sources S11 are formed by doping. The substrate 110i becomes a substrate 110a after doping, so that the substrate 110a has the drains D11 and the sources S11. That is, the drains D11 and the sources S11 are formed in the substrate 110a. In addition, a plurality of contacts T1 and contacts T2 can be formed on the drains D11 and the sources S11, respectively, for electric connection.

After the drains D11 and the sources S11 are formed, a semiconductor memory device 10 including a plurality of semiconductor memory cells 100 and the electric isolating structure 112 is basically completed. Each of the semiconductor memory cells 100 includes the substrate 110a, the first gate MG1, the second gate CG2, the first gate dielectric layer GD1, the second gate dielectric layer GD2, the first spacing film 126a, and the second spacing film 127b, in which the first gate MG1 is a memory gate, and the second gate CG2 is a select gate. Moreover, the substrate 110a, the first gate dielectric layer GD1, and the first gate MG1 can form a SONOS structure.

In one semiconductor memory cell 100, the first gate MG1 and the second gate CG2 are both formed on the substrate 110a, and between the drain D11 and the source S11. The first gate dielectric layer GD1 is disposed between the first gate MG1 and the substrate 110a, whereas the second gate dielectric layer GD2 is disposed between the second gate CG2 and the substrate 110a. The first spacing film 126a is disposed between the first gate MG1 and the second gate CG2, where the second gate CG2 covers the sidewall 126s and the top edge 126t. In addition, a level H1 of the top edge 126t relative to the substrate 110a is higher than a level H2 of the top edge 127t relative to the substrate 110a.

Based on the above, since the second gates cover the top edges of the first spacing films, the first spacing films can be protected by the second gates during the manufacturing process. Therefore, the breakdown voltage between the two gates (e.g. first gate and second gate) can be kept or increased.

While the invention has been described in terms of what is presently considered to be the most practical and embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a semiconductor memory device comprising:

providing a substrate;

forming a plurality of gate structures and a plurality of dielectric caps, wherein the gate structures are formed on the substrate and each gate structure comprise a first gate and a first gate dielectric layer, the first gate dielectric layer disposed between the first gate and the substrate, and the dielectric caps are formed atop the gate structures respectively;

forming a first dielectric layer covering the dielectric caps and a plurality of sidewalls of the gate structures;

forming a second dielectric layer covering the first dielectric layer, wherein materials of both the first dielectric layer and the second dielectric layer are different;

partially removing the second dielectric layer to reveal a plurality of top parts of the first dielectric layer and to form a plurality of first spacing films;

forming a plurality of second gates on the substrate, wherein the second gates covering and contacting the first dielectric layer and a top edge of the first spacing film;

removing the dielectric caps to reveal the first gates; and forming a plurality of drains and a plurality of sources in the substrate.

2. The method according to claim 1, wherein partially removing the second dielectric layer comprises performing a plasma etching.

3. The method according to claim 1, wherein removing the dielectric caps comprise performing a wet etching.

4. The method according to claim 1, wherein the substrate, the first gate dielectric layer, and the first gate form a SONOS structure.

5. The method according to claim 1, further comprising partially removing the first dielectric layer to reveal the dielectric caps after forming the second gates.

6. The method according to claim 1, further comprising forming an electric isolating structure in the substrate before forming the gate structures and the dielectric caps.

* * * * *